(12) United States Patent
Moline

(10) Patent No.: US 7,605,451 B2
(45) Date of Patent: Oct. 20, 2009

(54) RF POWER TRANSISTOR HAVING AN ENCAPSULATED CHIP PACKAGE

(75) Inventor: Dan Moline, Gilbert, AZ (US)

(73) Assignee: HVVi Semiconductors, Inc, Phoenix, AZ (US)

( * ) Notice: Subject to any disclaimer, the term of this patent is extended or adjusted under 35 U.S.C. 154(b) by 138 days.

(21) Appl. No.: 11/475,625

(22) Filed: Jun. 27, 2006

(65) Prior Publication Data

US 2007/0296077 A1 Dec. 27, 2007

(51) Int. Cl.
*H01L 23/495* (2006.01)
(52) U.S. Cl. .............. 257/666; 257/670; 257/676; 257/E23.043
(58) Field of Classification Search .......... 257/565, 257/713, 728, E23.08, E23.101, 666–678, 257/E23.043
See application file for complete search history.

(56) References Cited

U.S. PATENT DOCUMENTS

| | | | |
|---|---|---|---|
| 5,008,736 A | 4/1991 | Davies et al. | |
| 6,307,755 B1 * | 10/2001 | Williams et al. | 361/813 |
| 6,455,925 B1 | 9/2002 | Laureanti | |
| 6,566,749 B1 | 5/2003 | Joshi et al. | |
| 6,586,833 B2 | 7/2003 | Baliga | |
| 6,617,686 B2 | 9/2003 | Davies | |
| 6,649,975 B2 | 11/2003 | Baliga | |
| 6,653,691 B2 | 11/2003 | Baliga | |
| 6,674,157 B2 | 1/2004 | Lang | |
| 6,727,117 B1 | 4/2004 | McCoy | |
| 6,759,746 B1 | 7/2004 | Davies | |
| 6,777,786 B2 | 8/2004 | Estacio | |
| 6,784,366 B1 | 8/2004 | Boucher et al. | |
| 7,093,358 B2 | 8/2006 | Akram et al. | |
| 7,335,534 B2 | 2/2008 | Pavio | |
| 2003/0062601 A1 | 4/2003 | Harnden et al. | |
| 2003/0218237 A1 | 11/2003 | Hall et al. | |
| 2004/0043539 A1 * | 3/2004 | Lee et al. | 438/122 |
| 2004/0238934 A1 * | 12/2004 | Warner et al. | 257/686 |
| 2005/0017339 A1 * | 1/2005 | Yoshiba et al. | 257/686 |
| 2005/0121701 A1 * | 6/2005 | Hirano et al. | 257/287 |
| 2006/0189038 A1 | 8/2006 | Pavio | |
| 2006/0263944 A1 * | 11/2006 | Lange | 438/125 |
| 2007/0090434 A1 | 4/2007 | Davies et al. | |
| 2007/0132091 A1 | 6/2007 | Wu et al. | |
| 2008/0017998 A1 | 1/2008 | Pavio | |
| 2008/0093718 A1 | 4/2008 | Pavio | |

FOREIGN PATENT DOCUMENTS

WO 2005/069378 7/2005

OTHER PUBLICATIONS

"Packaging of Metal Post Interconnected Parallel Plate Structure (MPIPPS) Modules", 21 pages.
Adamson, Philip, "Lead-free Packaging for Discrete Power Semiconductors", International IOR Rectifier- as presented at the 2002 JEDEC Conference, (Apr./May 2002), 5 pages.

(Continued)

*Primary Examiner*—Lynne A. Gurley
*Assistant Examiner*—Vernon P Webb
(74) *Attorney, Agent, or Firm*—Cool Patent, P.C.; Kenneth J. Cool

(57) ABSTRACT

In various embodiments, semiconductor components and methods to manufacture semiconductor components are disclosed. In one embodiment, a method to manufacture semiconductor components includes attaching multiple heat spreaders to a semiconductor wafer. Other embodiments are described and claimed.

6 Claims, 18 Drawing Sheets

OTHER PUBLICATIONS

Bussarakons, Tiva, "New Materials and Technologies Solve Hermetic SMD Integration", International IOR Rectifier- as appeared in PCIM Power Electronic Systems Magazine, (Dec. 1999),5 pages.

Davies, Robert B., "Power Semiconductor Device and Method Therefor", US Patent Application filed Mar. 23, 2006, U.S. Appl. No. 11/387,617, 176 pgs.

Juhel, S., "PowerSO-10RF: The First True RF Power SMD Package", AN1294 Application Note, (Feb. 2001),12 pages.

Mahalingam, Mali, "Low Rth Device Packaging for High Power RF LDMOS Transistors for Cellular and 3G Base Station Use", Freescale Semiconductor, Inc., Motorola Inc. 2003, 4 pages.

Pavio, Jeanne S., "Semiconductor Component and Method of Manufacture", U.S. Appl. No. 11/458,566, filed Jul. 19, 2006; Confirmation #: 8992 Art Unit #: 3729 (copy not enclosed/attached).

Prophet, Graham, "Power FETs find their place", EDN, (Apr. 17, 2003), 6 pages.

Radivojevic, Z., "Novel Material for Improved Quality of RF-PA in Base-Station Applications", Presented at 10th International Workshop on Thermal Investigations of ICs and Systems, Co-Authored by Nokia Research Center and Freescale Semiconductor,(Sep./Oct. 2004),7 pages.

Sawle, Andrew, "DirectFET—A Proprietary New Source Mounted Power Package for Board Mounted Power", http://www.irf.com/technical-info/whitepaper/directfet.pdf, (Unknown), 5 pages.

Xu, Jane "GaN HEMTs based Flip-chip Integrated Broadband Power Amplifier", ONR M U R I Center Impact, Innovative Microwave Power Amplifier Consortium Center; University of California at Santa Barbara, 72 pages.

* cited by examiner

RF POWER TRANSISTOR HAVING AN ENCAPSULATED CHIP PACKAGE

FIELD OF THE INVENTION

Embodiments of the present invention relates generally to semiconductor technology, and more specifically to semiconductor components and methods of their manufacture.

BACKGROUND OF THE INVENTION

Semiconductor Component Manufacturers are constantly striving to increase the performance of their products, while decreasing their cost of manufacture. A cost intensive area in the manufacture of semiconductor components is packaging of a semiconductor die or chip. As those skilled in the art are aware, semiconductor die are fabricated in wafers, which may then be singulated or diced. One or more semiconductor die may be placed in a package to protect them from environmental and physical stresses.

Packaging semiconductor die may increase the cost and complexity of manufacturing semiconductor components because the packaging designs typically include several features such as, for example, providing protection, permitting transmission of electrical signals to and from the semiconductor die, and providing for removal of heat generated by the semiconductor die during operation.

Accordingly, it would be desirable to have a semiconductor package for removing heat from a semiconductor die and a method for manufacturing the semiconductor package that is cost efficient.

DETAILED DESCRIPTION OF THE DRAWINGS

For ease of understanding, elements in the figures are not necessarily drawn to scale, and like reference numbers are used where appropriate throughout the various figures.

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or the following abstract.

In the following description and claims, the terms "comprise" and "include," along with their derivatives, may be used and are intended as synonyms for each other. In addition, in the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may be that two or more elements do not contact each other but are joined together via another element or intermediate elements.

Figure 1:
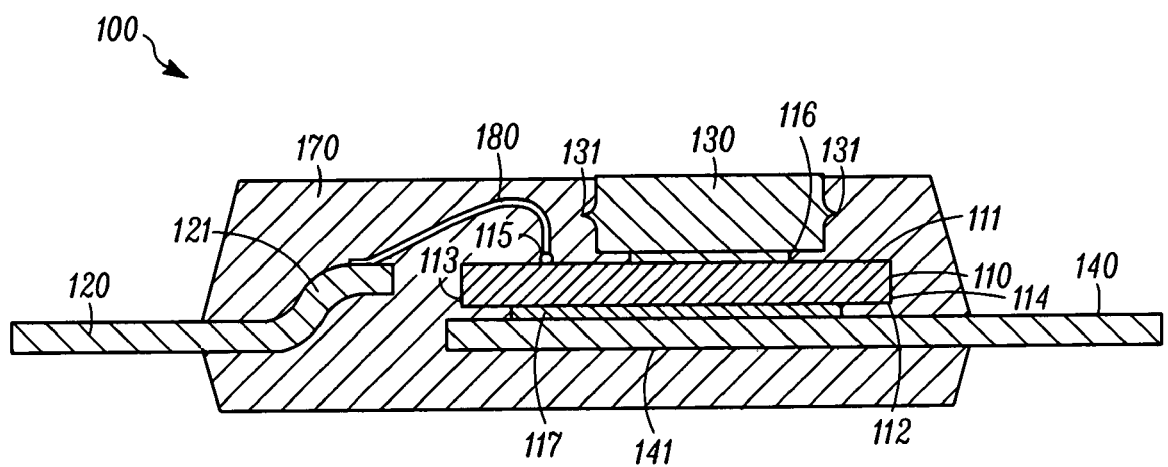
FIG. 1 is a cross sectional view of a semiconductor component in accordance with an embodiment of the present invention.

FIG. 1 is a cross sectional view of a semiconductor component 100 in accordance with an embodiment of the present invention. Various methods for making semiconductor component 100 are discussed below with reference to FIGS. 3 to 16.

In some embodiments, semiconductor component 100 includes a semiconductor die 110. Semiconductor die 110 may also be referred to as a semiconductor chip and has a top surface 111, a bottom surface 112, edges 113 and 114, and may include a semiconductor material such as, for example, silicon (Si) or gallium arsenide (GaAs). Although the scope of the present invention is not limited in this respect, in one embodiment, the width of die 110, that is, the distance between edge 113 of die 110 and edge 114 of die 110 may be about 57 mils (about 1450 microns). The thickness of die 110, that is, the distance between surfaces 111 and 112 may range from about two mils (about 50 microns) to about 15 mils (about 375 microns). As may be appreciated, a mil is one-thousandth of an inch.

Semiconductor component 100 may be a discrete component, wherein semiconductor die 110 comprises a discrete semiconductor device such as, for example, a discrete power transistor, although the scope of the present invention is not limited in this respect. A power transistor is a device that may be capable of handling at least one ampere of electrical current. In addition a power transistor is a device that can be coupled to relatively large operating voltage potentials of, for example, at least about 20 volts to over 100 volts, and may be used in power amplifiers to generate at least about one watt of output power.

Although the scope of the present invention is not limited in this respect, in some embodiments, semiconductor die 110 is a radio frequency (RF) power transistor constructed to operate at frequencies greater than about 50 megahertz (MHz) and to have a power output greater than about one watt. RF power transistors can be used in RF power amplifiers that may be used in wireless communications applications such as, for example, cellular base stations, high frequency (HF), very high frequency (VHF) and ultra high frequency (UHF) broadcast transmitters, and microwave radar and avionics systems. Some RF power amplifiers (RFPAs) provide from about five watts (W) to more than about 200 W of output power. In one embodiment, semiconductor die 110 is a RF power transistor adapted to operate at frequencies greater than about 500 megahertz (MHz) and has an output power greater than about five watts.

Further, in some embodiments, the power transistor of semiconductor die 110 comprises one or more vertical power transistor structures such as, for example, vertical metal oxide semiconductor field effect transistors (MOSFETs) or vertical bipolar power transistors. In the embodiments wherein semiconductor die 110 includes vertical MOSFETs, these vertical MOSFETs each have a source region, a drain region, and a gate. The vertical power transistor is vertical in that the source region and the drain region, or source interconnect and drain interconnect, are at or adjacent opposite surfaces of semiconductor die 110. The source and drain interconnects may also be referred to as source and drain electrodes. The gate of a vertical power transistor may be formed at the same surface of die 110 as the source region or interconnect of the vertical power transistor. During operation, the electrical current flow from the source region to the drain region in a vertical power transistor may be substantially perpendicular to the semiconductor die surfaces. In other words, current flows essentially vertically through a vertical MOSFET from a source region or interconnect located adjacent one surface of semiconductor die 110 to a drain region or interconnect located adjacent to the opposite surface of semiconductor die 110. An example of a vertical power transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

In other embodiments, the transistors in semiconductor die 110 may be vertical bipolar transistors such as insulated gate bipolar transistors (IGBTs). In such embodiments, one side of semiconductor die 110 may have an emitter region and a base region. The other side of the die may have a collector region.

Although semiconductor die 110 is described as including vertical transistors in some embodiments, this is not a limitation of the present invention. In alternate embodiments, semiconductor die 110 may include lateral transistor structures such as, for example, a laterally diffused metal-oxide-semiconductor (LDMOS) transistor structure. In an LDMOS power transistor, the gate, source region, and the drain region are located adjacent the same surface of a semiconductor die and electrical current flows laterally through the transistor between the source and drain regions of the LDMOS power transistor.

Vertical MOSFET devices may have some advantages over lateral transistors such as LDMOS devices. For example, the transistor cells in a vertical device may be relatively smaller and denser than the transistor cells in an LDMOS device, since the source region and the drain region in a vertical device are at opposite sides of the semiconductor die. Consequently, a vertical device may have a lower "on" resistance than an LDMOS device.

Returning to the example wherein semiconductor die 110 includes a discrete vertical power MOSFET, semiconductor die 110 may have a gate interconnect 115 coupled to surface 111, a source interconnect 116 coupled to surface 111, and a drain interconnect 117 coupled to surface 112. Interconnects may also be referred to as interconnections, contacts, terminals, or pads.

Interconnects 115, 116, and 117 are respectively coupled to a gate electrode, a source region, and a drain region of the vertical power transistor of semiconductor die 110. Gate interconnect 115 and source interconnect 116 may be wafer bumps. These wafer bumps may be gold-tin (AuSn) wafer bumps that may be formed on the die while the die is still part of a wafer. The wafer bumps 116 may be formed of gold having about a three micron tin cap to provide for gold-tin eutectic bonding to attach heat spreader 130 to wafer bumps 116. Drain interconnect 117 may be a layer of an electrically conductive material such as, for example, copper.

In this embodiment, semiconductor component 100 may include a gate lead 120, a drain lead 140, and a heat spreader 130. Leads may also be referred to as electrical leads, terminals or interconnects. Semiconductor die 110 may be coupled to a portion 141 of drain lead 140. Heat spreader 130 may serve as a source lead of semiconductor component 100 and may also be referred to as a heat sink. Accordingly, in this embodiment, gate lead 120 is coupled to the gate electrode of semiconductor die 110 via gate interconnect 115 and a wire bond 180; the source lead or heat spreader 130 is coupled to the source region of semiconductor die 110 via source interconnect 116; and drain lead 140 is coupled to the drain region of semiconductor die 110 via drain interconnect 117. As may be appreciated, electrical current may flow between heat spreader 130 and drain lead 140 by applying a voltage to gate lead 120.

Figure 19:
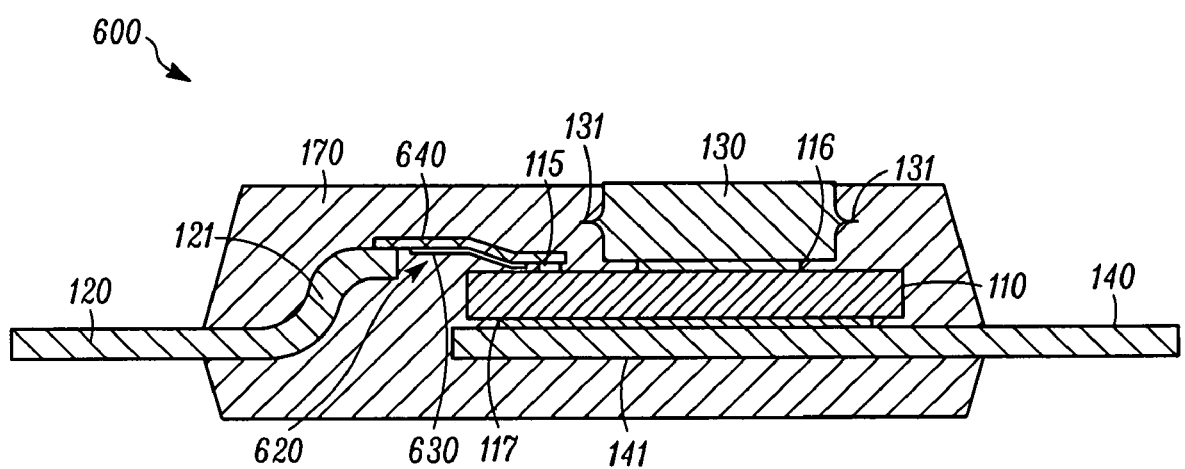
FIG. 19 is a cross sectional view of a semiconductor component in accordance with an embodiment of the present invention.
Figure 20:
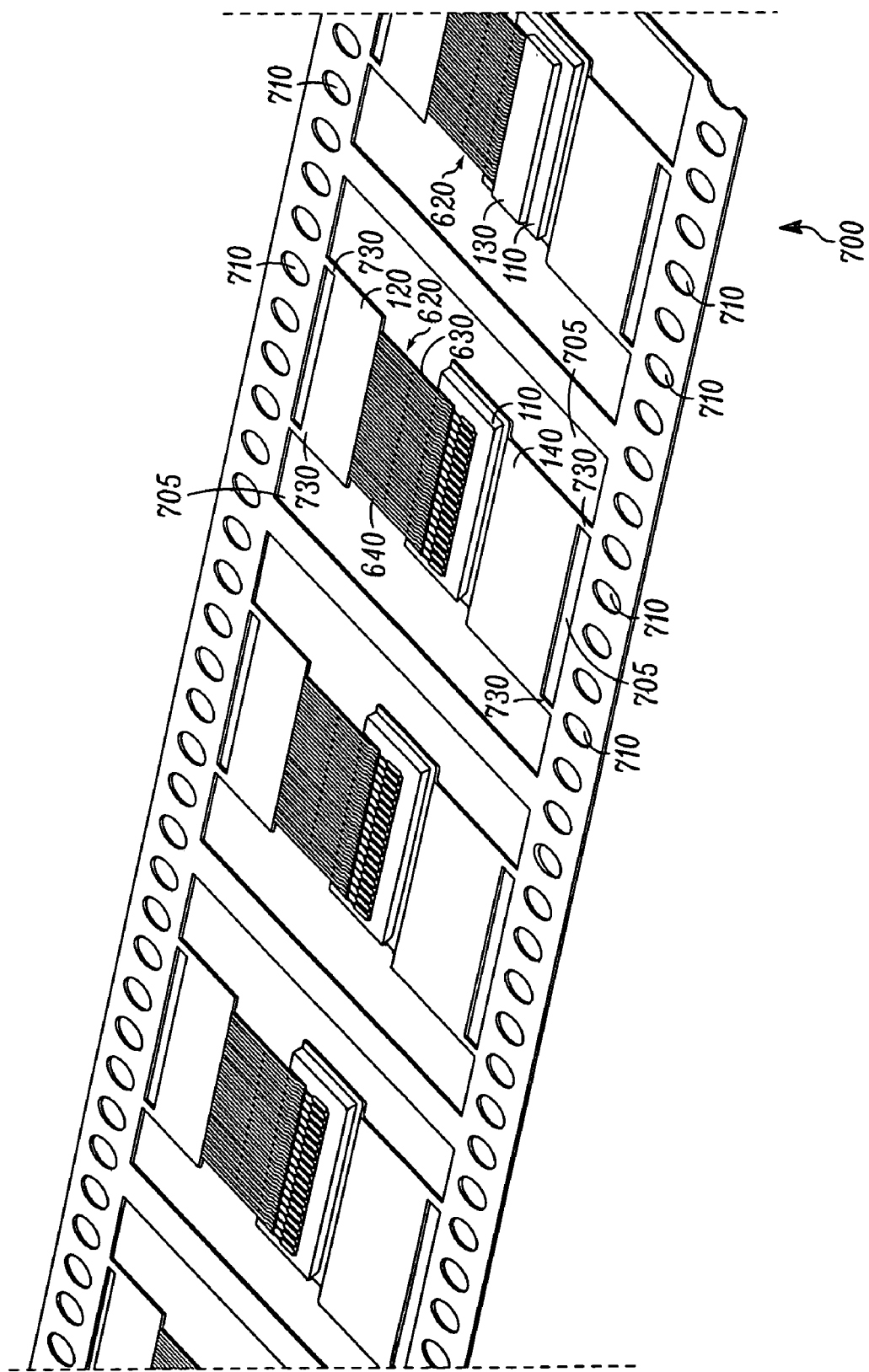
FIG. 20 is an isometric view of a leadframe during assembly in accordance with an embodiment of the present invention.

As is illustrated in FIG. 1, a portion 121 of gate lead 120 may optionally be bent to form a raised portion. This may provide a relatively closer and planar contact point to attach wire bond 180. In alternate embodiments, a metal clip (not shown) or a tape automated bonding (TAB) interconnect (not shown) may be used to couple gate interconnect 115 and gate lead 120. FIGS. 19 to 20 illustrate an embodiment that uses a TAB interconnect. Bending portion 121 of gate lead 120 may allow for a planar surface to couple gate lead 120 to gate interconnect 115 using wire bond 180, although the scope of the present invention is not limited in this respect.

Semiconductor component 100 may further include a packaging material 170 such as, for example, a plastic packaging material such as, for example, a plastic mold compound that encapsulates semiconductor die 110 and portions of heat spreader 130, gate lead 120, and drain lead 140. A portion of gate lead 120 is partially exposed external to semiconductor component 100 to provide electrical coupling of an external bias signal (not shown) such as, for example, a voltage ranging from about one to about four volts, to gate interconnect 115 from an external source (not shown); a portion of drain lead 140 is partially exposed external to semiconductor component 100 to provide electrical coupling of an external bias signal such as, for example, a voltage ranging from about 20 volts to about 100 volts, to drain interconnect 117 from an external source; and heat spreader 130 is partially exposed external to semiconductor component 100 to provide electrical coupling of an external bias signal such as, for example, ground potential, to source interconnect 116 from an external source. Heat spreader 130 is also partially exposed to allow coupling of heat spreader 130 to a thermally conductive material having a relatively low thermal resistance such as a metal heat sink (not shown) or flange (not shown) to provide a thermal path for removing heat generated by semiconductor die 110.

Heat spreader 130 may be formed by etching an electrically and thermally conductive material such as, for example, a copper substrate. Heat spreader 130 may be etched to form tips 131 that may serve as mold locks to increase pull-out resistance of heat spreader 130 after forming plastic packaging material 170 over a portion of heat spreader 130. The size of heat spreader 130 is sufficient to assist in maintaining the temperature of semiconductor die 110 at or below a predetermined temperature during operation of semiconductor die 110. For example, in some radio frequency (RF) applications, it may desirable to keep the junction temperature of a RF power transistor at a temperature of less than about 200 degrees Celsius (° C.) during operation.

As will be discussed further below, heat spreader 130 may be smaller than die 110 in terms of the length and width dimensions so that the edges of heat spreader 130 are formed spaced apart from the edges of semiconductor die 110. In the embodiment wherein semiconductor die 110 is a discrete power transistor, spacing heat spreader 130 away from the edges of semiconductor die 110 may be advantageous to increase the breakdown voltage of semiconductor component 100.

In some embodiments, the source interconnect 116 of die 110 may be coupled to ground and the drain interconnect 117 may be coupled to a relatively high voltage of, for example, a voltage potential ranging between at least about 20 volts (V) to over 100 V. During operation, electric field potentials may be concentrated at the edges of semiconductor die 110, and therefore, it may be advantageous to position heat spreader 130, which is coupled to ground, spaced apart from the edges of semiconductor die 110 to prevent arcing between die 110 and heat spreader 130 which may adversely affect the breakdown voltage of the power transistor of die 110.

In addition, forming an underfill dielectric material in the spaces between heat spreader 130 and die 110 may further increase the breakdown voltage of the power transistor. One example of an underfill dielectric material is polyimide. Alternatively, plastic packaging material 170 may flow between heat spreader 130 and die 110 during the encapsulation process to further increase the breakdown voltage of component 100. An underfill may also be used for mechanical integrity to relieve mechanical stresses in interconnects 115 and 116. As may be appreciated, the type of underfill dielectric material selected may alter drain-to-gate and drain-to-source capacitance depending on the dielectric constant of the underfill dielectric material.

In some embodiments, the underfill dielectric material may be introduced around the perimeter of the heat spreader either prior to sawing die 110 from the wafer or after attaching die 110 to a leadframe as is discussed below.

A wire bond 180 may be used to couple gate interconnect 115 to gate lead 120. Wire bond 180 may be made of either gold or aluminum and have a diameter of at least about one mil (about 25 microns), although the scope of the present invention is not limited in this respect.

Wire bond 180 may be formed at some distance away from die 110 so as to prevent reducing the breakdown voltage capability of the power transistor of die 110. Wire bond 180 may be formed to have a substantially vertical or perpendicular bond angle with respect to top surface 111 of die 110 to prevent arcing between die 110 and wire bond 180 which may adversely affect the breakdown voltage of the power transistor of die 110. In addition, forming wire bond 180 to have a perpendicular bond angle may reduce gate-to-drain capacitance in semiconductor component 100.

As a general guideline, for every one mil of air dielectric, this may result in about 50 volts of breakdown voltage. As may be appreciated, the breakdown voltage of the power transistor of component 100 may be increased by forming a dielectric material having a relatively higher dielectric constant between die 110 and wire bond 180. For example, if a dielectric material such as, for example, plastic packaging material 170 is between the edge of semiconductor die 110 and wire bond 180, this will increase the breakdown voltage of the power transistor compared to having only air between die 110 and wire bond 180. In one embodiment, the distance between edge 113 of semiconductor die 110 and wire bond 180 may be about 5 mils.

Further, the height of interconnects 115 and 116 may be set to provide a relatively higher breakdown voltage. For example, in some embodiments, interconnects 115 and 116 may be formed having a height ranging from about one mil (about 25 microns) to about two mils (about 50 microns).

Although semiconductor die 110 has been described as a power transistor, this is not a limitation of the present invention. In alternate embodiments, semiconductor die 110 may comprise a small-signal transistor. A small-signal transistor typically controls relatively small electrical currents such as, for example, less than about one ampere of current, and dissipate less than about one watt of power.

Although semiconductor component 100 and semiconductor die 110 are described as comprising a discrete device, this is not a limitation of the present invention. In alternate embodiments, semiconductor component 100 and/or semiconductor die 110 may be an integrated circuit (IC) rather than a discrete device or discrete component. For example, semiconductor die 110 may be an integrated circuit having high density digital logic and a power device such as, a power transistor, integrated together on the same die. In the example wherein semiconductor die 110 is an IC, semiconductor component 100 may be referred to as a discrete component and may have more than the three leads shown in the cross section of FIG. 1.

Accordingly, the type of package configuration illustrated in FIG. 1 may provide cost, electrical, and thermal performance advantages, such as providing a relatively low resistance thermal path (heat spreader 130) to remove heat generated by semiconductor die 110. Further, electrical performance may be improved by not using wire bonds to couple the source regions of die 110 to heat spreader 130. Not using wire bonds may reduce parasitic inductance. In the embodiment wherein component 100 uses a plastic packaging material, this may be relatively cheaper compared to using a ceramic material to encapsulate die 110.

Further the package configuration of component 100 may allow for a relatively high breakdown voltage due to the size and placement of heat spreader 130, the perpendicular angle formation of wire bond 180, and the height of interconnects 115 and 116. In addition, the package configuration of component 100 may provide a relatively low interelectrode capacitance between the gate and drain in embodiments using a wire bond 180 formed as illustrated in FIG. 1.

Figure 2:
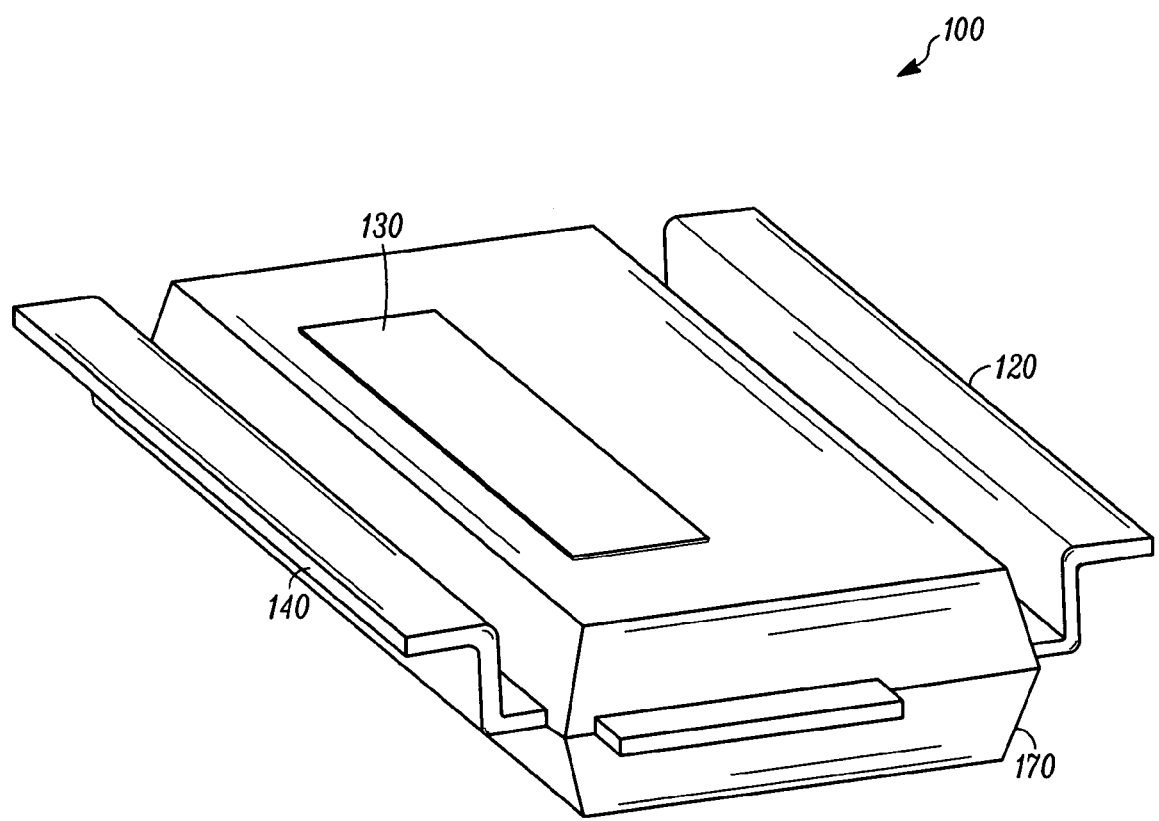
FIG. 2 is an isometric sectional view of a semiconductor component in accordance with an embodiment of the present invention.

Further, subsequent process steps to the package of component 100 may further adjust the form factor for some customer applications. For example, leads 120 and 140 may be bent as is shown in FIG. 2 to form gull-wing shaped leads so that portions of leads 120, 130, and 140 are substantially coplanar to allow for surface mounting. The package illustrated in FIG. 2 may be a surface mount package, and semiconductor component 100 may be referred to as a surface mount device (SMD) in this embodiment. In other words, the package configuration of semiconductor component 100 illustrated in FIG. 2 may allow for surface mounting semiconductor component 100 either on a printed circuit board (PCB) or in another package since a surface of lead 120 is substantially coplanar to a surface of lead 140 and a surface of heat spreader 130. A plurality of these surface mount devices may be placed in a tape and reel system to allow these packages to be used in a tape and reel assembly process. Tape and reel systems may provide a convenient means of conveyance to allow the automated placement of component 100 either on a printed circuit board (PCB) or in another package such as package 400 illustrated below with reference to FIGS. 17 and 18.

As may be appreciated, the package configuration of semiconductor component 100 may allow for a "carrier package" that may facilitate handling and/or testing of component 100. For example, in the embodiment wherein die 110 is a discrete power transistor, small signal or direct current (DC) testing may be performed on semiconductor component 100 prior to subsequent assembly processes. RF testing may also be performed if a test fixture is available to provide impedance matching for semiconductor component 100. Semiconductor component 100 may also be referred to as a "die carrier" package.

Figure 3:
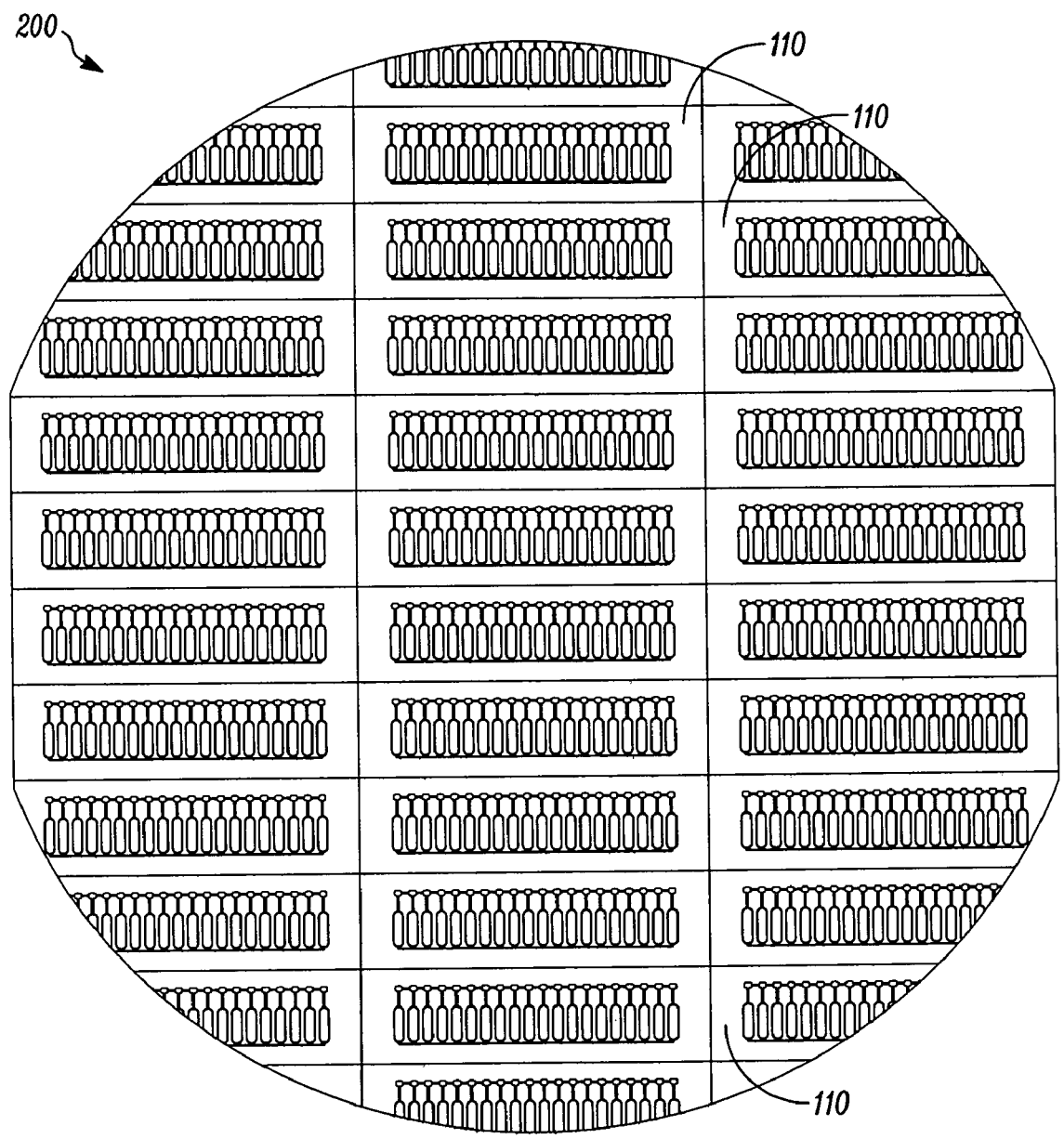
FIG. 3 is top view of a semiconductor wafer during assembly in accordance with an embodiment of the present invention.

Turning to FIGS. 3 to 16, various embodiments for manufacturing a semiconductor component, such as, for example, semiconductor component 100 (FIG. 1) are discussed. FIG. 3 is top view of a semiconductor wafer 200 during assembly in accordance with an embodiment of the present invention.

Semiconductor component 100 may include a plurality of semiconductor die 110, wherein each die is a discrete semiconductor device such as, for example, a discrete power transistor, although the scope of the present invention is not limited in this respect.

Figure 4:
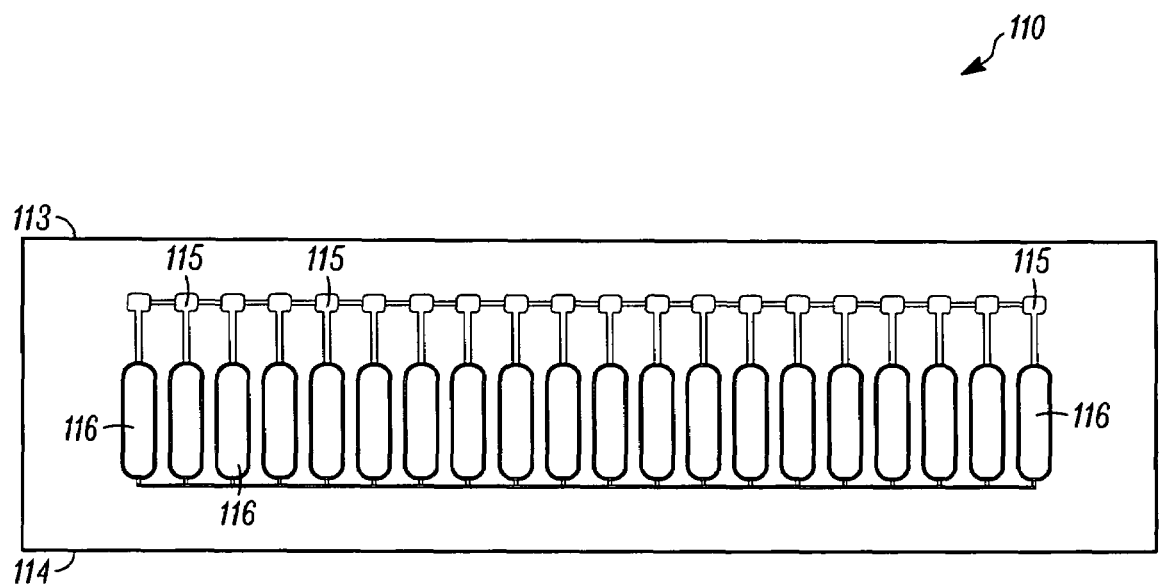
FIG. 4 is a top view of a semiconductor die of the wafer of FIG. 3 in accordance with an embodiment of the present invention.

In the embodiment illustrated in FIG. 3, each semiconductor die 110 may include 20 transistor cells. Although die 110 is illustrated as having 20 transistor cells in some embodiments, this is not a limitation of the present invention. In other embodiments, die 110 may have fewer or more transistor cells. FIG. 4 illustrates a single die 110 of wafer 200. For purposes of clarity, all the die of wafer 200 are not shown in FIG. 4 to show the features of a single die. FIG. 4 shows that on the top surface of each die 110, gate and source interconnects 115 and 116 are formed. All of the gate interconnects 115 may be electrically coupled to each other and all of the source interconnects 116 may be electrically coupled to each other. Gate interconnects 115 may also be referred to as gate pads or gate wafer bumps, and similarly, source interconnects 116 may also be referred to as source pads or source wafer bumps.

Interconnects 115 and 116 may be formed by a wafer bumping process. In one embodiment, interconnects 115 and 116 are formed by bumping die 110 with gold bumps and subsequently plating about three microns of tin on the gold bumps. The gold-tin bumps may have a height of about one to about two mils. Interconnects 115 and 116 may be rectangular shaped. Source interconnects 116 may be about 6 mils (about 150 microns) wide and may be spaced apart from each other by about 2.5 mils (about 60 microns).

Although die 110 is illustrated as having 20 transistor cells, this is not a limitation of the present invention. In other embodiments, die 110 may have more or fewer transistors.

Figure 5:
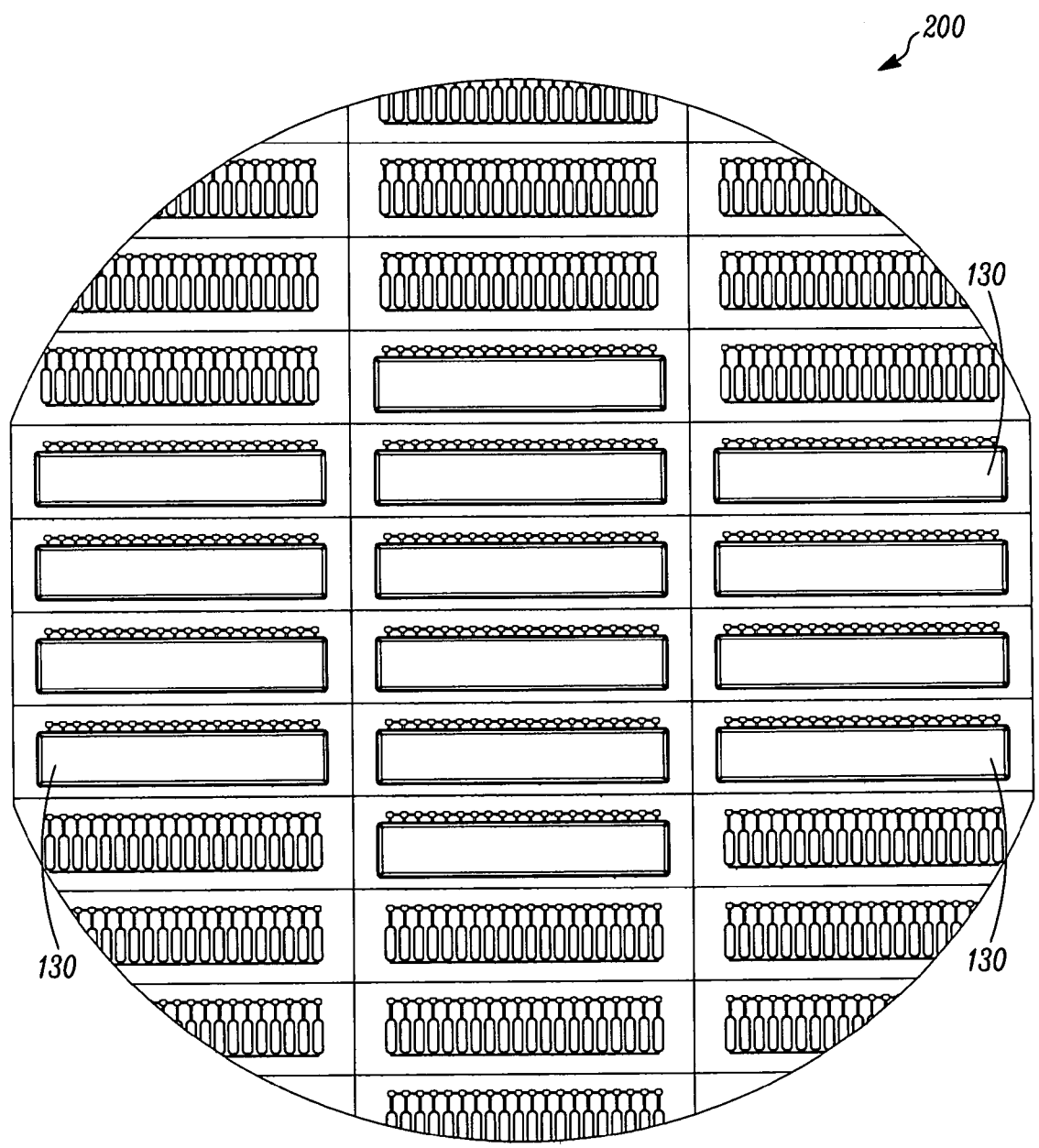
FIG. 5 is a top view of the semiconductor wafer of FIG. 3 at a later stage of assembly in accordance with an embodiment of the present invention.

FIG. 5 is a top view of a portion of a semiconductor wafer 200 at a later stage of assembly in accordance with an embodiment of the present invention. Heat spreaders 130 are attached to wafer 200 prior to sawing wafer 200.

As discussed above, heat spreaders may be formed by etching an electrically and thermally conductive material such as, for example, a copper substrate. Heat spreader 130 may be etched to form tips 131 that may serve as mold locks. In alternate embodiments, heat spreaders 130 may be formed by performing a stamping operation, wherein the stamping operation comprises stamping an electrically and thermally conductive material such as, for example, copper or a copper alloy. The stamping operation may further include forming a burr on a portion of each heat spreader to provide a mold lock on the heat spreaders.

In some embodiments, heat spreaders 130 may be coupled to source interconnects 116 of wafer 200 using eutectic bonding. This may include using thermo compression to attach heat spreaders 130 to source interconnects 116 of die 110. For example, a die bonder (not shown) may be used to pick up a heat spreader 130 and place the heat spreader on source interconnects 116 of a die 110. Then, heat and pressure may be applied to form the eutectic bond. A eutectic bond may be formed by heating two (or more) materials such as, for example, gold (Au) or tin (Sn), such that the materials diffuse together to form an alloy composition (for example, a 80Au-20Sn eutectic) that melts at a lower temperature than the base materials (for example, a 80Au-20Sn eutectic melts at about 280° C.). In one embodiment, a temperature of about 280° C. is applied to wafer 200 and heat spreaders 130 to attach heat spreaders 130 to wafer 200.

In some embodiments, in addition to heating and applying pressure, some motion such as for example, ultrasonic or side-side motion, may be applied to heat spreaders 130 to form the bond between interconnects 116 and heat spreaders 130. The bonding of heat spreaders 130 to die 110 may be referred to as insitu die bonding.

As may be appreciated, contact between all interconnects 116 of each die and the corresponding heat spreader 130 may enhance the thermal conductivity to remove heat generated by die 130. If contact to only some, but not all, of the interconnects 116 is made by heat spreader 130, then optimal removal of heat from die 110 may not be achieved.

Although the scope the present invention is not limited in this respect, in some embodiments, heat spreaders 130 may be gold plated or tin plated. A barrier material such as, for example, nickel, may be formed on heat spreader 130 prior to plating heat spreader 130 with tin.

Figure 6:
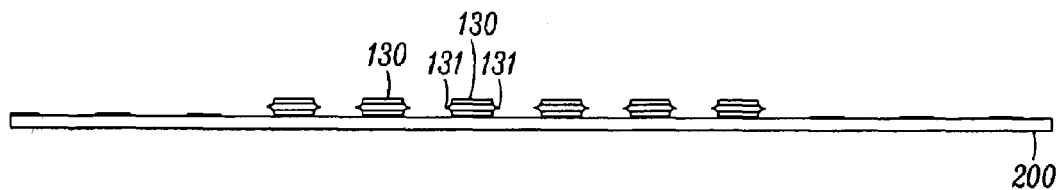
FIG. 6 is a side view of the wafer shown FIG. 5 in accordance with an embodiment of the present invention.

FIG. 6 is a side view of wafer 200 during assembly in accordance with an embodiment of the present invention. FIG. 6 shows a number of heat spreaders 130 attached to wafer 200.

Figure 7:
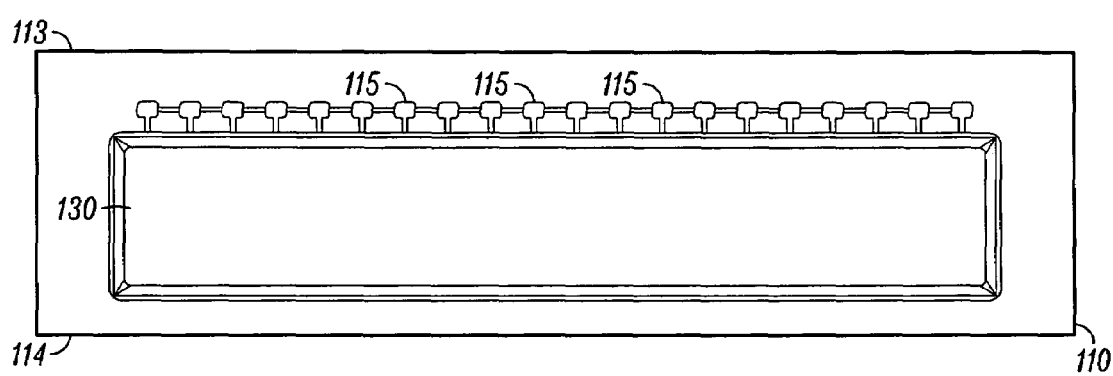
FIG. 7 is a top view of a die cut from the wafer shown in FIG. 5 in accordance with an embodiment of the present invention.
Figure 8:
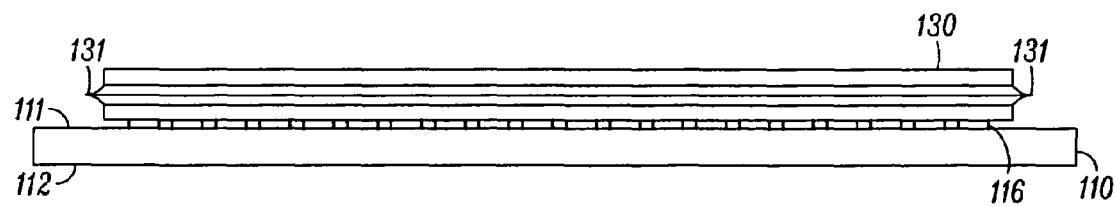
FIG. 8 is a side view of the die shown in FIG. 7 in accordance with an embodiment of the present invention.

FIG. 7 is a top view of a die 110 at a later stage of assembly in accordance with an embodiment of the present invention. Wafer 200 may be singulated using sawing with a diamond blade or a laser to generate a plurality of die 110. FIG. 7 illustrates a single die 110 having the attached heat spreader 130 after singulating wafer 200. Turning briefly to FIG. 8, FIG. 8 is a side view of die 110 after being cut from wafer 200. As is illustrated in FIGS. 7 and 8, in some embodiments, tips 131 of heat spreader 130 may be a continuous mold lock structure on the periphery of heat spreader 130.

In addition, as is discussed above and as is illustrated in FIGS. 7 and 8, in some embodiments, heat spreader 130 may be smaller than die 110 in terms of the length and width dimensions so that the edges of heat spreader 130 are formed spaced apart from the edges of semiconductor die 110. In some embodiments, the length and width of the heat spreader may be determined by the minimum dimensions needed to contact all of the source bumps of a single die. The size of heat spreader 130 may be altered as the die size changes. Contacting all of the source bumps may be needed to provide optimal thermal conductivity. Although in alternate embodiments, contact to less than all of the interconnects may be made by heat spreader 130.

In some embodiments, heat spreader 130 may extend past the source bumps by a distance approximately equal to the thickness of heat spreader 130. This may increase heat flow from the die through the heat spreader.

In one embodiment, semiconductor die 110 is rectangular shaped and has a length of about 202 mils (about 5130 microns), a width of about 57 mils (about 1450 microns), and a thickness ranging from about four mils (about 100 microns) to about eight mils (about 200 microns). Heat spreader 130 is rectangular shaped and has a length of about 185 mils (about 4700 microns), a width of about 30 mils (about 760 microns), and a thickness of at least about 10 mils (about 250 microns). Heat spreader 130 may be attached to all twenty source interconnects 116.

Although not shown, at this stage, the plurality of die 110 singulated from wafer 200 may rest on a plastic film frame conveyance mechanism. A die bonder may be used to pick up die from the plastic film frame and place the die on a leadframe such as, for example, leadframe 300 illustrated in FIG. 9.

Figure 9:
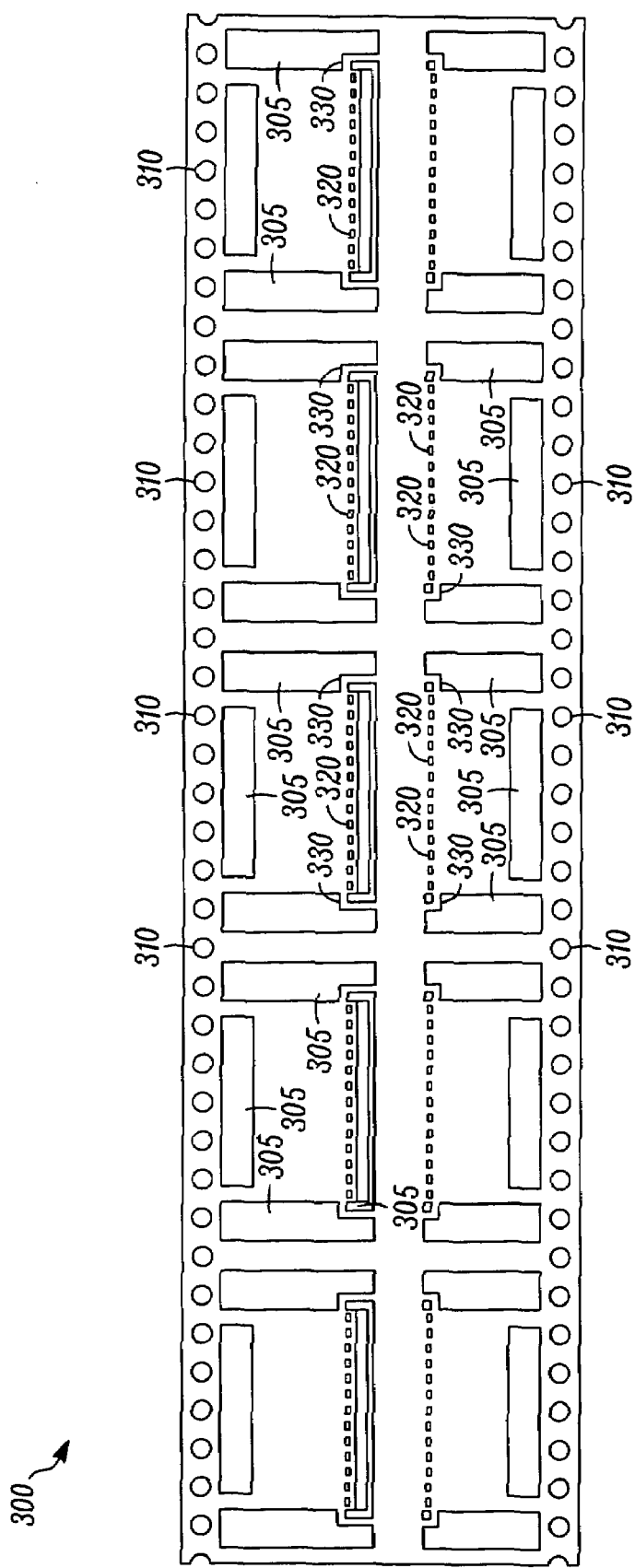
FIG. 9 is a top view of a portion of a leadframe during assembly in accordance with an embodiment of the present invention.

FIG. 9 is a top view of a portion of a leadframe 300 during assembly in accordance with an embodiment of the present invention. In some embodiments, leadframe 300 may be formed by performing a stamping operation, wherein the stamping operation comprises stamping an electrically conductive material such as, for example, copper or a copper alloy. In alternate embodiments, leadframe 300 may be formed by etching an electrically conductive material, such as, for example, a metal substrate or alloy. In some embodiments, leadframe 300 may comprise copper. As will be discussed below, in some embodiments, leadframe 300 may be singulated after the encapsulation of multiple semiconductor components.

The stamping or etching may be done to produce a plurality of openings or holes having various shapes such as, for example, holes 305, 310, and 320. Leadframe 300 may include a plurality of index holes 310 that allow for the controlling of leadframe 300 during assembly using a conveyance mechanism. Holes 320 may be used for mold locks for a mold compound that encapsulates portions of leadframe 300 at a later stage of assembly. Leadframe 300 may further include support structures or tie bars 330 that may be cut or trimmed away at a later stage of assembly to provide electrical isolation.

Figure 10:
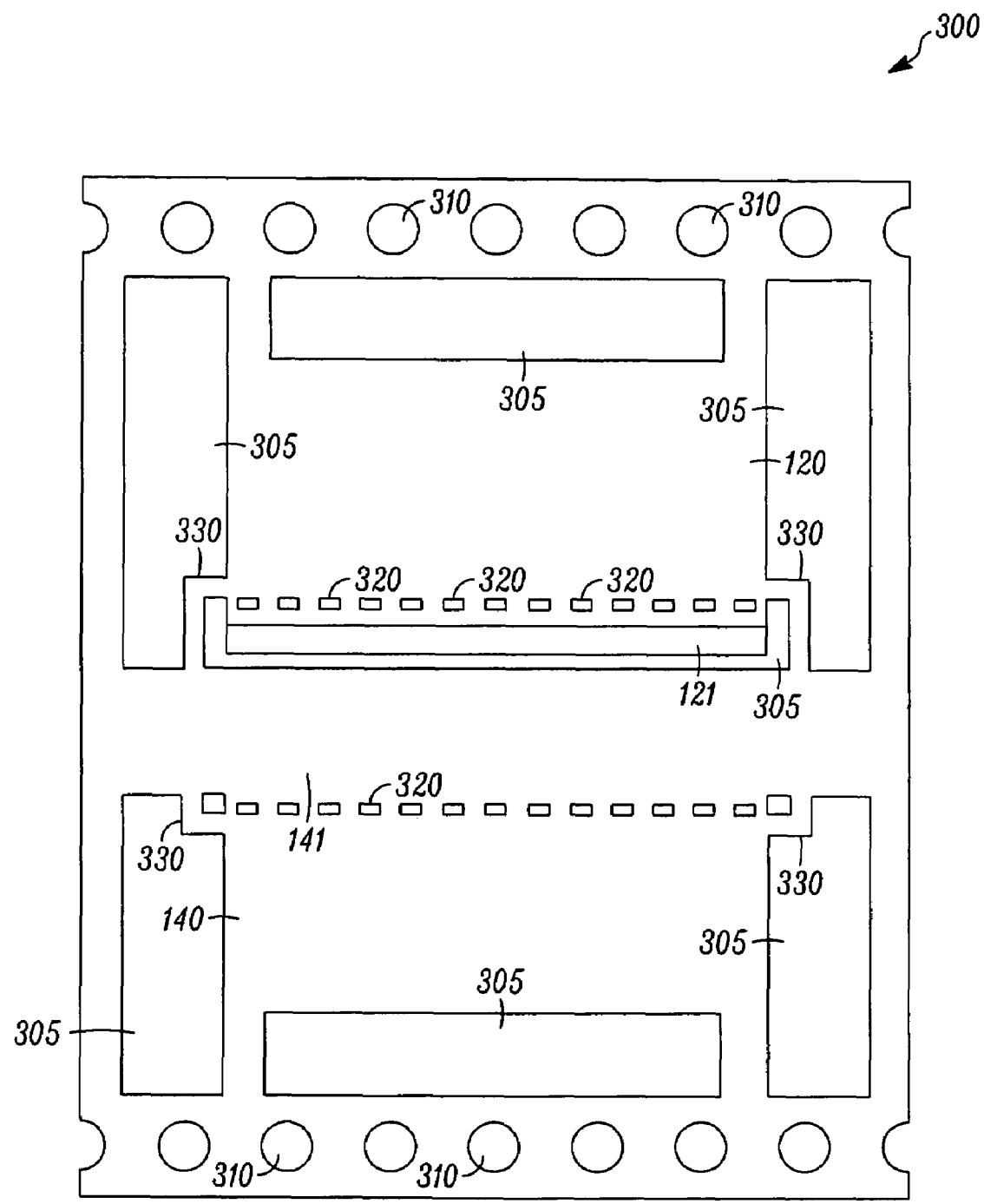
FIG. 10 is a top view showing a portion of the leadframe of FIG. 9 that is used to manufacture a single semiconductor component in accordance with an embodiment of the present invention.
Figure 11:
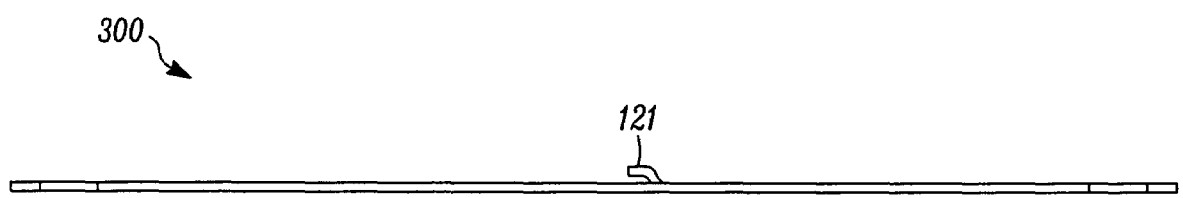
FIG. 11 is a side view of the leadframe shown in FIG. 10 in accordance with an embodiment of the present invention.

Leadframe 300 may be used to manufacture multiple semiconductor components. FIG. 10 is a top view of a portion of leadframe 300 which is used to form a single semiconductor component such as, for example, semiconductor component 100 (FIG. 1). To highlight different features of leadframe 300, only the portion of leadframe 300 that is used to manufacture a single semiconductor component is illustrated in FIG. 10. The portions of leadframe 300 that correspond to leads 120 and 140 of semiconductor component 100 are denoted in FIG. 10. FIG. 11 illustrates that a portion 121 of leadframe 300 may be bent to form a raised gate lead. In other words, leadframe 300 may have a gate lead 120 that has a raised portion 121. Raised portion 121 may be formed using a stamping operation.

Figure 12:
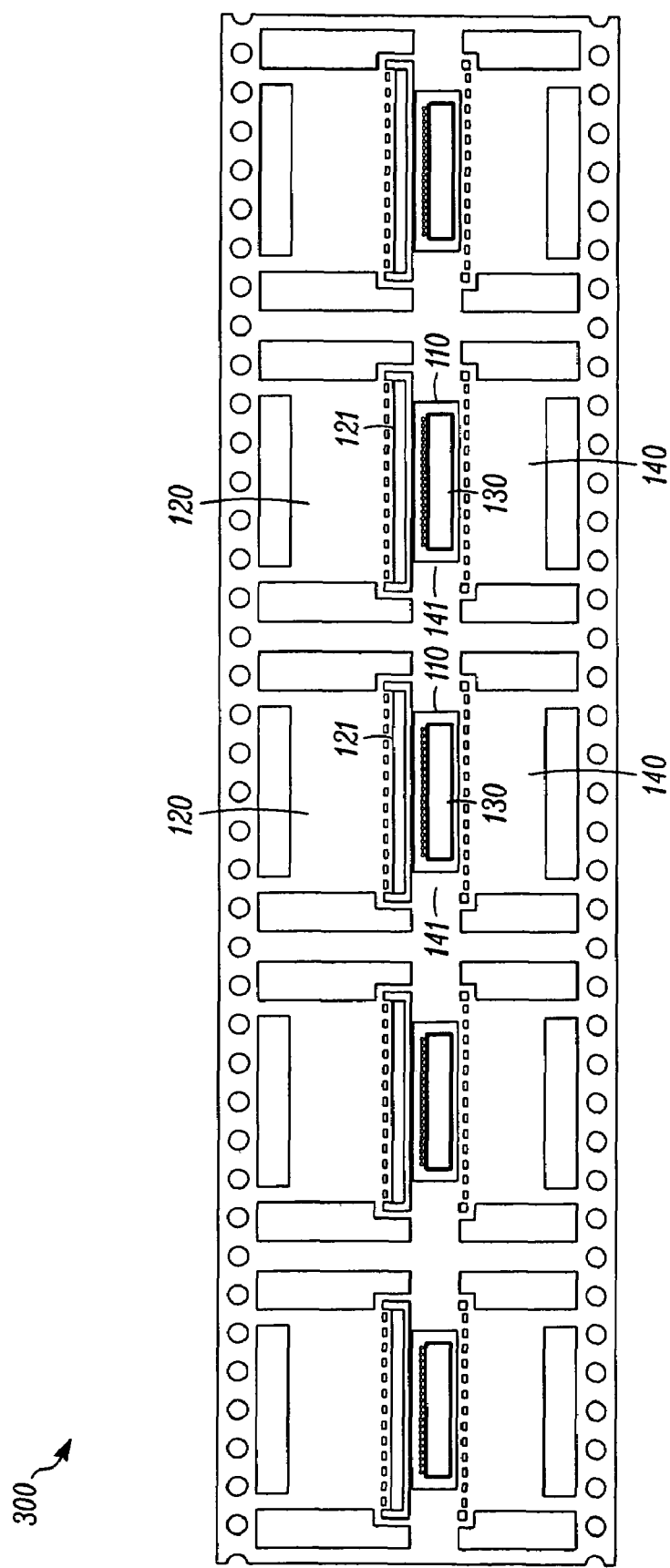
FIG. 12 is a top view of a portion of the leadframe shown in FIG. 9 at a later stage of assembly in accordance with an embodiment of the present invention.

FIG. 12 is a top view of a portion of leadframe 300 at a later stage of assembly in accordance with an embodiment of the present invention. In some embodiments, multiple semiconductor die 110 with attached heat spreaders 130 are coupled to portions 141 of leadframe 300.

Semiconductor die 110 may be coupled to leadframe 300 using solder or a conductive epoxy (not shown). For example, in one embodiment, a conductive epoxy may be deposited on leadframe 300. Next, a die bonder may be used to pick up die 110 having the attached heat spreader 130 and then die 110 may be placed on the conductive epoxy. The structure may then enter into a heating operation or curing cycle to snap cure the epoxy. This process may take several minutes. In one embodiment, the attaching of heat spreaders 130 to wafer 200 as described above is performed at a temperature of about 280° C. and die 110 is subsequently attached to lead frame at about a temperature of about 200° C. during the curing cycle.

Figure 13:
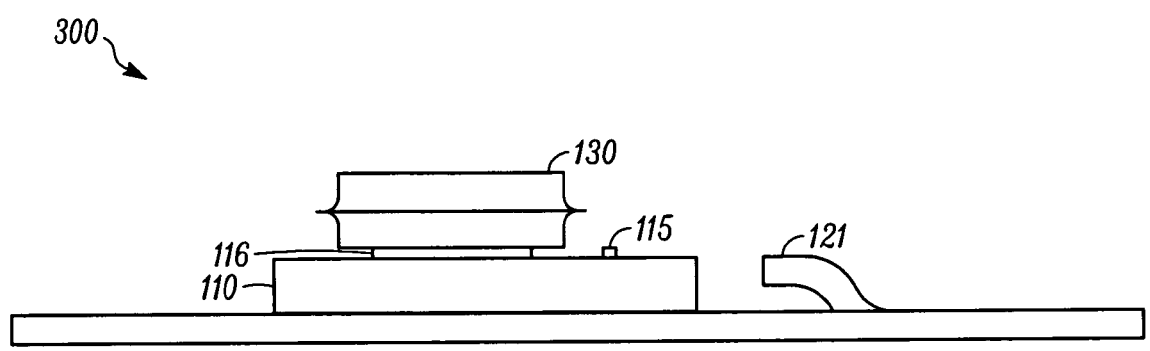
FIG. 13 is a side view of a portion of the leadframe shown in FIG. 12 in accordance with an embodiment of the present invention.

FIG. 13 is a side view of a portion of leadframe 300 during assembly in accordance with an embodiment of the present invention. FIG. 13 shows leadframe 300 after attaching die 110 to leadframe 300. Interconnect 115 is not a wafer bump in some embodiments. For example, if a wire bond is used to couple lead 120 to die 110, then interconnect 115 may be a pad or conductive trace on a surface of die 110 as wafer bumps are not needed for wire bonding.

Figure 14:
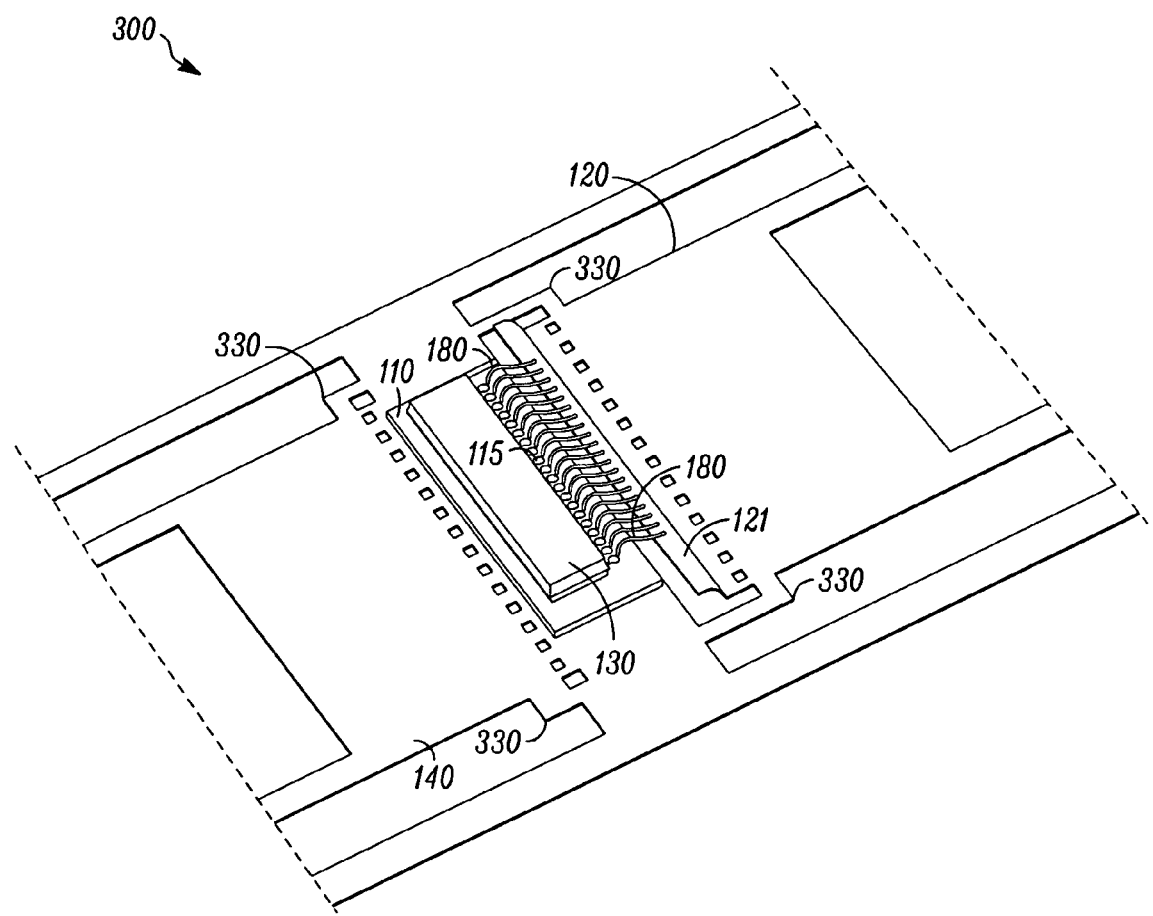
FIG. 14 is an isometric view of a portion of the leadframe shown in FIG. 13 at a later stage of assembly in accordance with an embodiment of the present invention.

FIG. 14 is an isometric view of a portion of leadframe 300 at a later stage of assembly in accordance with an embodiment of the present invention. After attaching die 110 to leadframe 100, wire bonds 180 may be formed to couple gate interconnects 115 to portion 121 of lead 120.

Wire bond 180 may be made of either gold or aluminum and the diameter of wire bonds 180 may range from about one mil to about two mils (about 50 microns), although the scope of the present invention is not limited in this respect.

Figure 15:
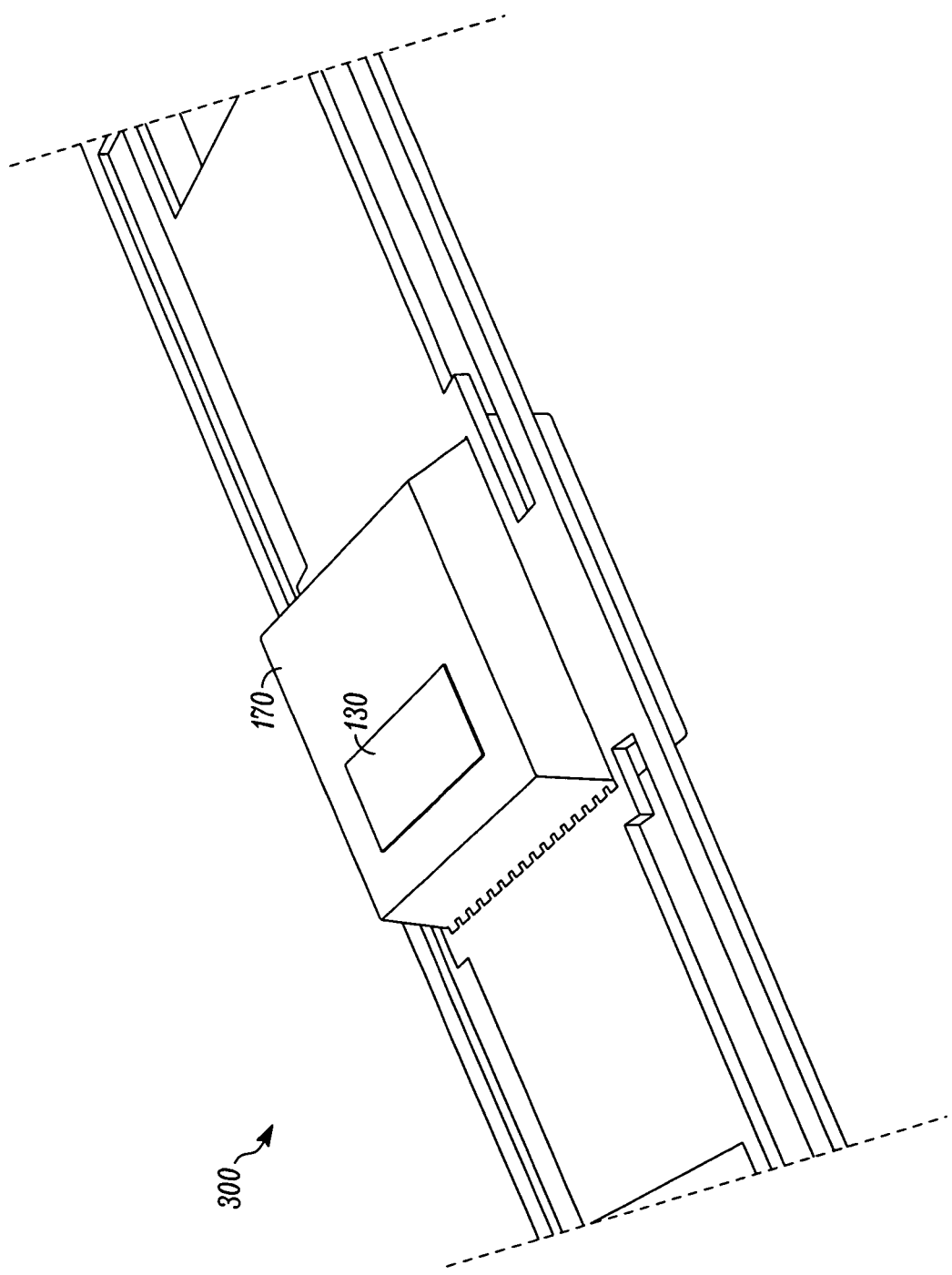
FIG. 15 is an isometric view of a portion of the leadframe shown in FIG. 14 at a later stage of assembly in accordance with an embodiment of the present invention.

FIG. 15 is an isometric view of a portion of leadframe 300 at a later stage of assembly in accordance with an embodiment of the present invention. After the wire bonding, an injection mold process may be performed. For example, all of the semiconductor die 110 and a portion of leadframe 300 may be encapsulated using a molding compound or plastic packaging material 170.

A portion 131 of heat spreaders 130 is exposed after encapsulation. A "de-flash" process may be used to remove excess mold compound that is formed on exposed portion 131 of heat spreader 130. For example, a sand blast operation may be used to remove excess mold compound formed on portion 131 of heat spreader 130.

Next, leadframe 300 may be singulated into individual semiconductor components 100 using sawing or laser cutting. During the singulating, tie bars 330 of leadframe 300 may be removed. In some embodiments, each individual packaged component 100 includes at least one semiconductor die 110, wherein each die 110 comprises a discrete radio frequency (RF) power transistor.

Figure 16:
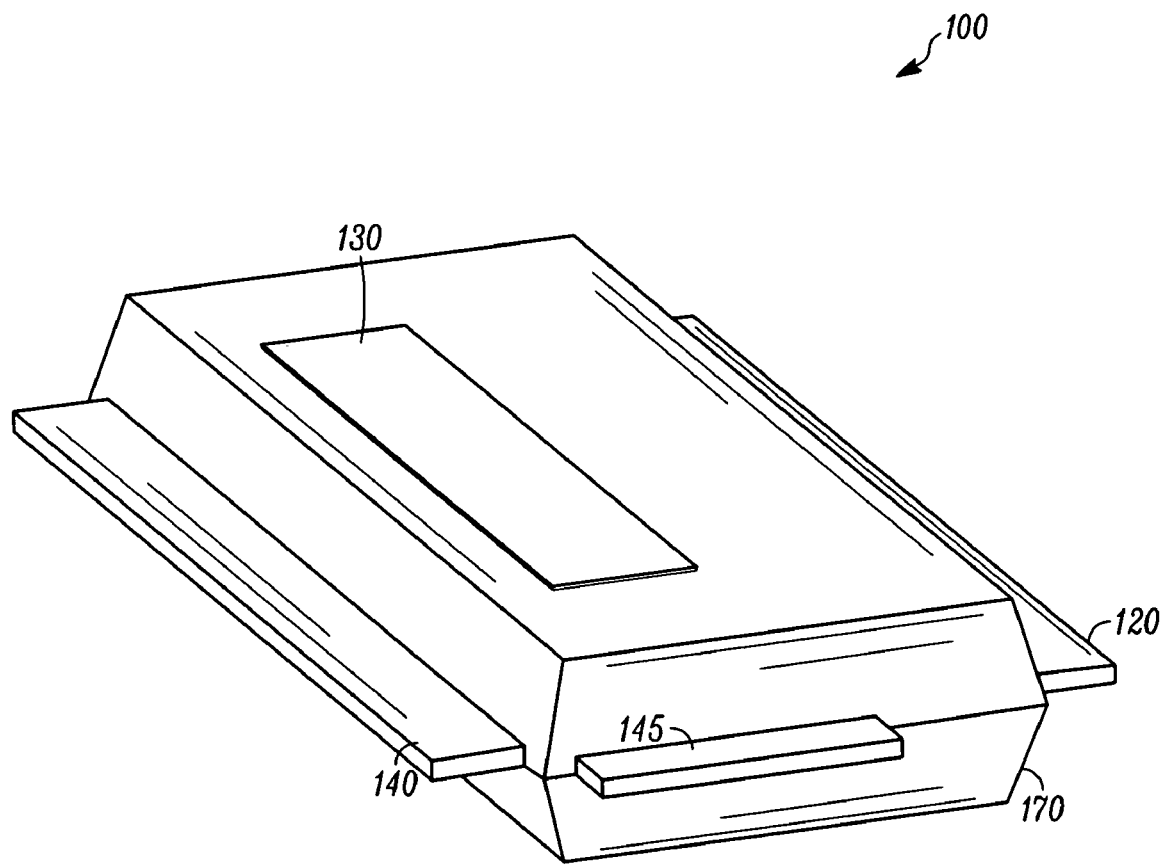
FIG. 16 is an isometric view of a semiconductor component after singulating the semiconductor component from the leadframe shown in FIG. 15 in accordance with an embodiment of the present invention.

FIG. 16 is an isometric view of semiconductor component 100 after singulating leadframe 300. As is discussed above, in some embodiments, semiconductor component 100 is a discrete power transistor including drain lead 140, gate lead 120, and heat spreader 130 that serves as a source lead. In addition, in some embodiments, semiconductor component 100 includes drain leads 145. Drain leads 145 may also be referred to as tabs or terminals and may provide two additional access points on the ends of component 100 to provide electrical coupling to the drain region of the power transistor. Drain leads 145 provide an access point that is physically closer to the drain region of the power transistor compared to drain lead 140. Drain leads 145 may be used to couple output impedance matching networks that may include inductors and capacitors (not shown in FIG. 16). Although two drain leads 145 are shown in FIG. 16, this is not a limitation of the present invention. One or more than two drain leads may be formed.

In some embodiments, after singulating leadframe 300 to form multiple individual semiconductor components 100, these components may be placed in a tape and reel for transporting these components to another stage of assembly. For example, packaged semiconductor component 100 may be mounted on a printed circuit board (PCB) or semiconductor components 100 may be placed in another package such as, for example, package 400 shown in FIG. 17.

Figure 17:
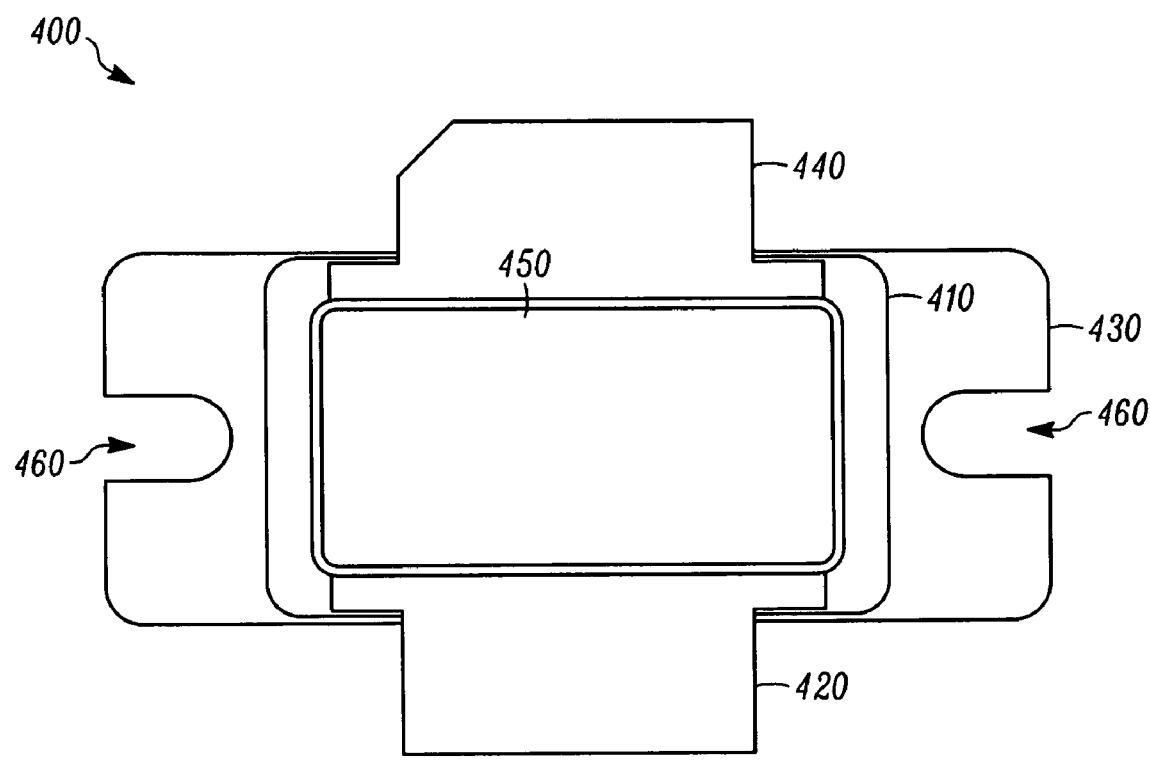
FIG. 17 is a top view of a metal-ceramic package.

FIG. 17 is a top view of a metal-ceramic package 400. Package 400 may include a flange 430 that may comprise copper (Cu) and tungsten (W). In some embodiments, flange 430 may be a copper substrate as opposed to a copper alloy. Package 400 may further include a ceramic ring 410 and leads 420 and 440. Leads 420 and 440 may be copper leads. Flange 430 may have a cavity 450 formed in a central portion of flange 430. Further, package 400 may include mounting holes 460.

Ceramic ring 410 may be formed on a portion of a top surface of flange 430. Leads 440 and 420 may be formed on portions of ceramic ring 410. Ceramic ring 410 may provide electrical isolation so that flange 430 and leads 420 and 440 are electrically isolated from each other.

Figure 18:
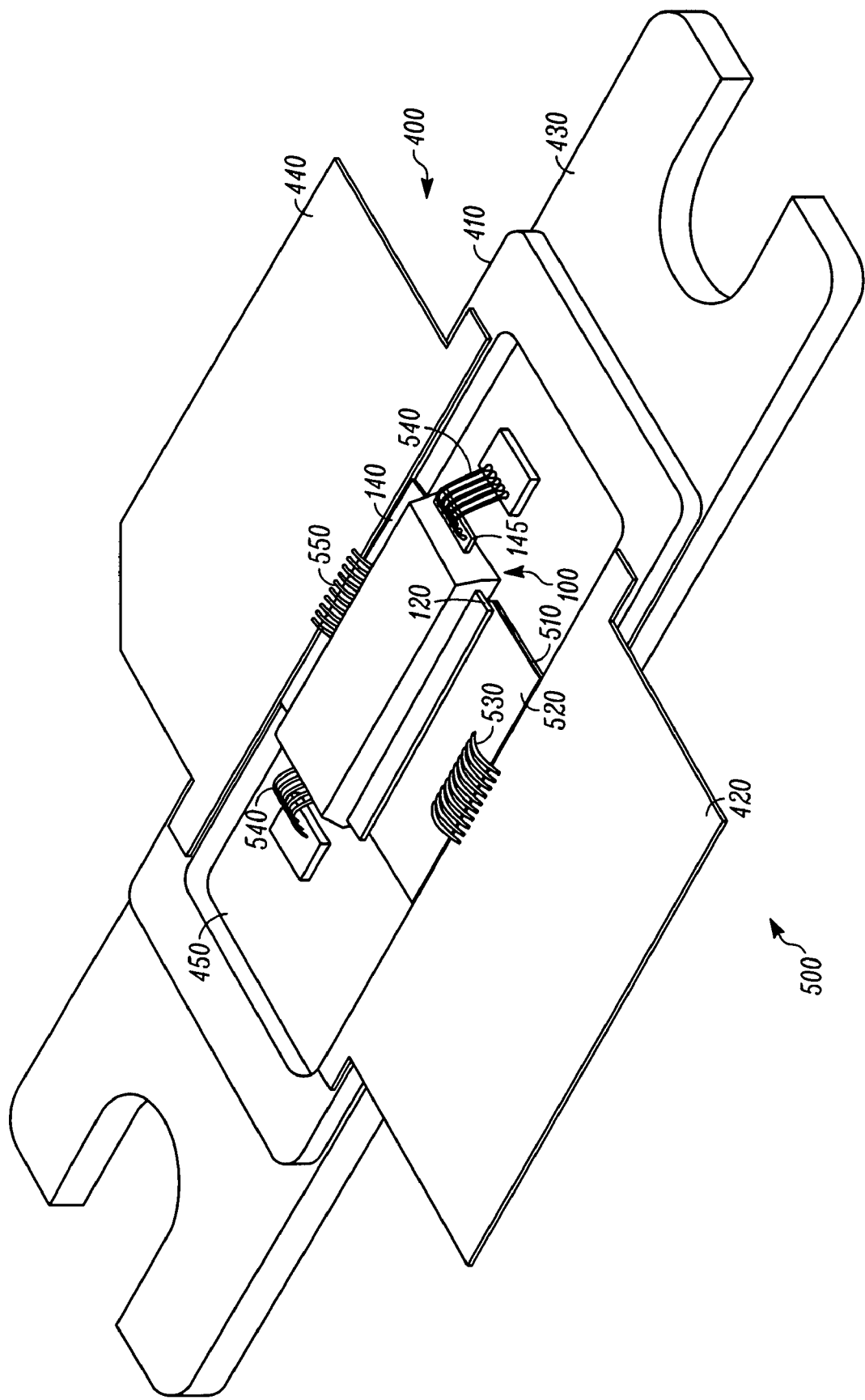
FIG. 18 is an isometric view of a semiconductor package assembly in accordance with an embodiment of the present invention.

FIG. 18 is an isometric view of a semiconductor package assembly 500 in accordance with an embodiment of the present invention. Assembly 500 may include plastic packaged semiconductor component 100 mounted in metal-ceramic package 400. Assembly 500 may also be referred to as a component.

A ceramic material 510 may be formed in cavity 450 and have a conductive material 520 such as, copper, overlying a top surface of ceramic material 510. Wire bonds 530 may be formed contacting lead 420 and conductive material 520 to electrically couple lead 420 to lead 120 of component 100.

In some embodiments, assembly 500 may be a packaged discrete power transistor and lead 420 may be a gate lead, lead 440 may be a drain lead, and flange 430 may be a source lead and may also serve as a heat spreader or heat sink to dissipate heat generated by die 110 (not shown in FIG. 18) in component 100. Although not shown, heat spreader 130 of component 100 may be coupled to flange 430 to form a thermal path for dissipating heat generated by die 110.

An output impedance matching network may be formed using wire bonds 540 coupled to drain leads 145. Wire bonds 540 may provide shunt inductance for output impedance matching.

In some embodiments, an input impedance matching network (not shown) may be formed in cavity 450. The input impedance matching network may include a capacitor coupled between leads 420 and 120, and may be coupled using wire bonds that may serve as inductors in the input impedance matching network.

Wire bonds 550 may be formed contacting lead 440 and lead 140 to electrically couple lead 440 to lead 140 of component 100. A ceramic lid (not shown) may be coupled to leads 420 and 440 and ceramic ring 410 using an epoxy to enclose the components in cavity 450.

The embodiment discussed with reference to FIG. 18 may be referred to as a package within a package component and may be suitable for use in RF applications. For example, assembly 500 may be part of the main output amplifier of an RF power amplifier that may be used in a wireless system such as a cellular network.

FIG. 19 is a cross sectional view of a semiconductor component 600 in accordance with an embodiment of the present invention. Semiconductor component 600 is similar to semiconductor component 100 discussed above.

Although the scope of the present invention is not limited in this respect, in some embodiments, die 110 is a discrete semiconductor device such as, for example, a discrete power transistor having gate interconnect 115, source interconnect 116, and drain interconnect 117. Heat spreader 130 may be attached to die 110 when die 110 is part of a wafer as is discussed above.

A tape automated bonding (TAB) interconnect 620 may be used to electrically couple gate lead 120 to gate interconnect 115. Tape automated bonding (TAB) may be a process utilizing metal conductors or conductive traces on a flexible tape material that may be mass bonded to pads or interconnects on a die in a single operation. TAB interconnect 620 may include a flexible dielectric material 630. Suitable materials for dielectric material 630 may include organic materials, polyimide, epoxy-glass resin, or KAPTON® (KAPTON® is a registered trademark of DuPont for its polyimide film). A conductive material 640 such as, for example, copper, may be formed on a surface of dielectric material 630. Conductive material 640 may be gold plated copper in some embodiments.

Dielectric material 630 of TAB interconnect 620 may prevent arcing between die 110 and conductive material 640. As discussed above, this may improve the breakdown voltage of the power transistor of die 110 since arcing may adversely affect the breakdown voltage.

Although TAB interconnect 620 is shown as being coupled to raised portion 121 of gate lead 120 in the embodiment illustrated in FIG. 19, this is not a limitation of the present invention. In alternate embodiments, gate lead 120 may not have a raised portion, and may be a substantially planar lead. In these embodiments, although not shown, TAB interconnect 620 may be attached to the substantially planer gate lead and TAB interconnect 620 may flex to couple to gate interconnect 115 and lead 120 if these contacts are not coplanar. In addition, in alternate embodiments, TAB interconnects may be used to couple other interconnects of die 110 to other terminals other than a gate terminal of the package that houses die 110.

FIG. 20 is an isometric view of a leadframe 700 during assembly in accordance with an embodiment of the present invention. Leadframe 700 is similar to leadframe 200 discussed above and leadframe 700 may be used to manufacture multiple semiconductor components. For example, leadframe 700 may be used to manufacture semiconductor component 600 (FIG. 19).

Leadframe 700 may comprise copper and may be formed by stamping or etching a copper substrate. The stamping or etching may be done to produce a plurality of openings or holes having various shapes such as, for example, holes 705 and 710.

Leadframe 700 may include a plurality of index holes 710 that allow for the controlling of leadframe 700 during assembly using a conveyance mechanism. Although not shown, leadframe 700 may include holes for mold locks for a mold compound that encapsulates portions of leadframe 700 at a later stage of assembly. Leadframe 700 may further include support structures or tie bars 730 that may be cut or trimmed away at a later stage of assembly to provide electrical isolation. The portions of leadframe 700 that correspond to leads 120 and 140 of semiconductor component 600 (FIG. 19) are denoted in FIG. 20.

After die 110 are attached to leadframe 700, TAB interconnects 620 may be coupled to gate bumps 115 of die 110 and to gate lead 120 using solder. Although not shown, a subsequent injection mold operation and a subsequent singulation of leadframe 700 may be performed to form multiple semiconductor components such as, for example, semiconductor component 600 (FIG. 19).

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

I claim:

1. A discrete radio frequency (RF) power transistor, comprising:
   a semiconductor chip;
   a gate terminal coupled to the semiconductor chip, a source terminal coupled to the semiconductor chip, a first drain terminal coupled to the semiconductor chip, and a second drain terminal coupled to the semiconductor chip;
   a plastic packaging material encapsulating the semiconductor chip, a portion of the gate terminal, a portion of the source terminal, a portion of the first drain terminal, and a portion of the second drain terminal; and
   a wire bond to couple the gate terminal to the semiconductor chip, the wire bond having a substantially perpendicular bond angle with respect to a surface of the semiconductor chip to reduce arcing between the semiconductor chip and the wire bond, or to reduce gate-to-drain capacitance, or combinations thereof
   wherein the gate terminal is bent to provide a closer and planar contact to the gate interconnect to couple to the wire bond and wherein at least one or more of the first drain terminal or the second drain terminal, or combinations thereof, are substantially unbent and coplanar with an unbent portion of the gate terminal to allow for surface mounting of the discrete RF power transistor on a planar surface, wherein at least two or more terminals are substantially coplanar.

2. The discrete RF power transistor of claim 1, further comprising a third drain terminal coupled to the semiconductor chip.

3. The discrete RF power transistor of claim 1, wherein the discrete RF power transistor is a surface mount device (SMD).

4. The discrete RF power transistor of claim 1,
   wherein the source terminal is a heat spreader;
   wherein the heat spreader is rectangular shaped and the semiconductor chip is rectangular shaped; and
   wherein a length of the heat spreader is less than a length of the semiconductor chip and a width of the heat spreader is less than a width of the semiconductor chip.

5. The discrete RF power transistor of claim 1, wherein the semiconductor chip comprises a vertical power transistor having a source region and a drain region that are at opposite surfaces of the semiconductor chip and wherein the source terminal is coupled to the source region and the first and second drain terminals are coupled to the drain region.

6. The discrete RF power transistor of claim 1, wherein the source terminal comprises a heat spreader, the heat spreader having one or more tips formed thereon to contact the plastic packing material to at least partially increase pull-out resistance of heat spreader from the plastic packing material.

* * * * *